United States Patent
Dressel et al.

(10) Patent No.: US 11,888,279 B2
(45) Date of Patent: Jan. 30, 2024

(54) METHOD OF ATTACHING A CONTACT ELEMENT TO A CONDUCTIVE PATH A CONDUCTOR PLATE

(71) Applicant: TE Connectivity Germany GmbH, Bensheim (DE)

(72) Inventors: Andre Martin Dressel, Lampertheim (DE); Gunther Chritz, Birkenau (DE); Jens Huber, Heppenheim (DE)

(73) Assignee: TE Connectivity Germany GmbH, Bensheim (DE)

( * ) Notice: Subject to any disclaimer, the term of this patent is extended or adjusted under 35 U.S.C. 154(b) by 0 days.

(21) Appl. No.: 16/540,229

(22) Filed: Aug. 14, 2019

(65) Prior Publication Data
US 2020/0059056 A1 Feb. 20, 2020

(30) Foreign Application Priority Data

Aug. 14, 2018 (DE) .......................... 102018213639.4

(51) Int. Cl.
*H01R 43/02* (2006.01)
*H01R 4/02* (2006.01)
(Continued)

(52) U.S. Cl.
CPC ........... *H01R 43/0221* (2013.01); *H01R 4/02* (2013.01); *H01R 9/03* (2013.01); *H01R 12/57* (2013.01);
(Continued)

(58) Field of Classification Search
CPC ...... H01R 43/0221; H01R 4/02; H01R 12/57; H01R 13/15; H01R 9/03; H05K 1/181;
(Continued)

(56) References Cited

U.S. PATENT DOCUMENTS 3,610,874 A * 10/1971 Gagliano ............... B23K 26/22
219/121.64
4,531,044 A * 7/1985 Chang .................. H05K 3/3421
219/121.13
(Continued)

FOREIGN PATENT DOCUMENTS

CH 701973 A1 * 4/2011 ............ H01R 4/029
CN 101018641 A 8/2007
(Continued)

OTHER PUBLICATIONS

German Office Action, dated Apr. 11, 2019, 5 pages.
(Continued)

*Primary Examiner* — Jeffrey T Carley
(74) *Attorney, Agent, or Firm* — Barley Snyder

(57) ABSTRACT

PROBLEM TO BE SOLVED: To provide a laser jointing method that joints two materials while imparting a sufficient strength thereto and minimizing heat influence. SOLUTION: The method overlaps first and second materials (V1, V2) on each other and irradiates the surface of the first material (V1) with a laser light (103) from the side of the first material (V1). When jointing both materials (V1, V2), the method intermittently irradiating an overlapped part of the first and second materials (V1, V2) with the laser light while moving the laser light (103) to form a welding bead (1) on the surface of the first material (V1), wherein the length of the welding bead (1) is formed gradually shorter.

11 Claims, 5 Drawing Sheets

(51) Int. Cl.
*H01R 9/03* (2006.01)
*H01R 12/57* (2011.01)
*H01R 13/15* (2006.01)
*H05K 1/18* (2006.01)
*H05K 3/32* (2006.01)

(52) U.S. Cl.
CPC ............. *H01R 13/15* (2013.01); *H05K 1/181* (2013.01); *H05K 3/328* (2013.01); *H05K 2201/10628* (2013.01)

(58) Field of Classification Search
CPC ..... H05K 3/328; H01L 23/3675; H01L 23/15; H01L 23/3736; H01L 23/49827; H01L 23/49833; H01L 23/49838; H01L 23/49866
USPC ................. 29/842, 843, 879, 878, 877, 860
See application file for complete search history.

(56) References Cited

U.S. PATENT DOCUMENTS

| | | | | |
|---|---|---|---|---|
| 5,971,251 | A * | 10/1999 | Moore | H01R 43/0228 228/180.5 |
| 7,878,871 | B2 * | 2/2011 | VanSlembrouck | B23K 11/0026 439/874 |
| 8,563,364 | B2 | 10/2013 | Stolze et al. | |
| 2002/0029473 | A1 * | 3/2002 | Kwoka | H01L 23/49582 29/885 |
| 2003/0114022 | A1 | 6/2003 | Franzen et al. | |
| 2004/0228036 | A1 * | 11/2004 | Yamaguchi | G11B 5/4853 |
| 2007/0199926 | A1 * | 8/2007 | Watanabe | H05K 3/328 219/121.64 |
| 2008/0308536 | A1 * | 12/2008 | Theppakuttai | G01R 3/00 219/121.64 |
| 2009/0223940 | A1 * | 9/2009 | Hosoya | B23K 26/22 219/121.64 |
| 2010/0270275 | A1 * | 10/2010 | Nakamae | B23K 26/009 219/121.64 |
| 2011/0147080 | A1 * | 6/2011 | Slininger | H01R 43/0221 174/84 R |
| 2015/0126078 | A1 * | 5/2015 | Kawamura | H01R 43/02 439/874 |
| 2016/0021747 | A1 * | 1/2016 | Chow | H05K 1/116 174/260 |
| 2016/0366757 | A1 * | 12/2016 | Kobayashi | H05K 1/181 |
| 2017/0104287 | A1 * | 4/2017 | Grzywok | H01R 4/029 |
| 2017/0213777 | A1 * | 7/2017 | Soyano | H01L 23/49866 |
| 2018/0281110 | A1 * | 10/2018 | Newman | B23K 26/21 |

FOREIGN PATENT DOCUMENTS

| | | | | |
|---|---|---|---|---|
| CN | 102934532 A | | 2/2013 | |
| CN | 107005013 A | | 8/2017 | |
| DE | 10 2010 030 070 A1 | | 2/2012 | |
| DE | 102010030070 A1 | | 2/2012 | |
| DE | 10 2012 215 055 A1 | | 4/2013 | |
| EP | 0010610 A1 * | | 5/1980 | |
| EP | 1514634 A1 * | | 3/2005 | ........... B23K 26/144 |
| EP | 2583540 A1 * | | 4/2013 | ......... H01R 43/0221 |
| EP | 3610982 A1 * | | 2/2020 | ........... B23K 26/244 |
| JP | 2012125829 A | | 7/2012 | |
| WO | WO-9005041 A1 * | | 5/1990 | |
| WO | 2008031366 A1 | | 3/2008 | |
| WO | 2011157585 A1 | | 12/2011 | |

OTHER PUBLICATIONS

English translation and Abstract of CN203503826, dated Mar. 26, 2014, 8 pages.
English translation and Abstract of CN201955586, dated Aug. 31, 2011, 8 pages.
English translation and Abstract of JP2002025639, dated Jan. 25, 2002, 16 pages.
Abstract not available for DE 102010030070, corresponding abstract of WO2011157585 attached, dated Feb. 2, 2012, 2 pages.
Abstract of WO2008031366, dated Mar. 20, 2008, 2 pages.
European Patent Office, Extended European Search Report, Application No. EP 19190736, dated Jan. 20, 2020, 7 pages.
Abstract of DE102010030070, dated Feb. 2, 2012, 2 pages.
"Datasheet Surface Mount Pin Header", dated Jun. 22, 2017, XP002796338, retrieved from Internet: URL: https://eu.mouser.com/datasheet/2/418/NG_CD_794628_H1-1260035.pdf (retrieved on Dec. 9, 2019), 1 page.
First Office Action from the CNIPA dated Oct. 18, 2022 corresponding to Application No. 201910747952.2 including an English translation, 20 pages.

* cited by examiner

METHOD OF ATTACHING A CONTACT ELEMENT TO A CONDUCTIVE PATH A CONDUCTOR PLATE

CROSS-REFERENCE TO RELATED APPLICATION

This application claims the benefit of the filing date under 35 U.S.C. § 119(a)-(d) of German Patent Application No. 102018213639.4, filed on Aug. 14, 2018.

FIELD OF THE INVENTION

The present invention relates to an attachment of a contact element and, more particularly, to an attachment of a contact element to a conductive path of a conductor plate.

BACKGROUND

A contact element can be attached to a conductive path of a conductor plate according to various methods. The contact element can be attached by soldering, for example. To do this, it is necessary to use flux which, where appropriate, must be removed later in the production method. A further possibility is production using through-hole technology (THT), however, this requires the drilling of holes. The current methods of attaching the contact element to the conductive path are thus complex.

SUMMARY

A method of attaching a contact element to a conductor plate includes welding the contact element to a conductive path of the conductor plate in a surface-mounted manner with a laser beam.

BRIEF DESCRIPTION OF THE DRAWINGS

The invention will now be described by way of example with reference to the accompanying Figures, of which.

DETAILED DESCRIPTION OF THE EMBODIMENT(S)

The invention is explained below by way of example and in greater detail with reference to the drawings. The embodiments and configurations depicted are each independent of one another and can be combined with one another as desired, depending on necessity in the specific application.

Figure 1:
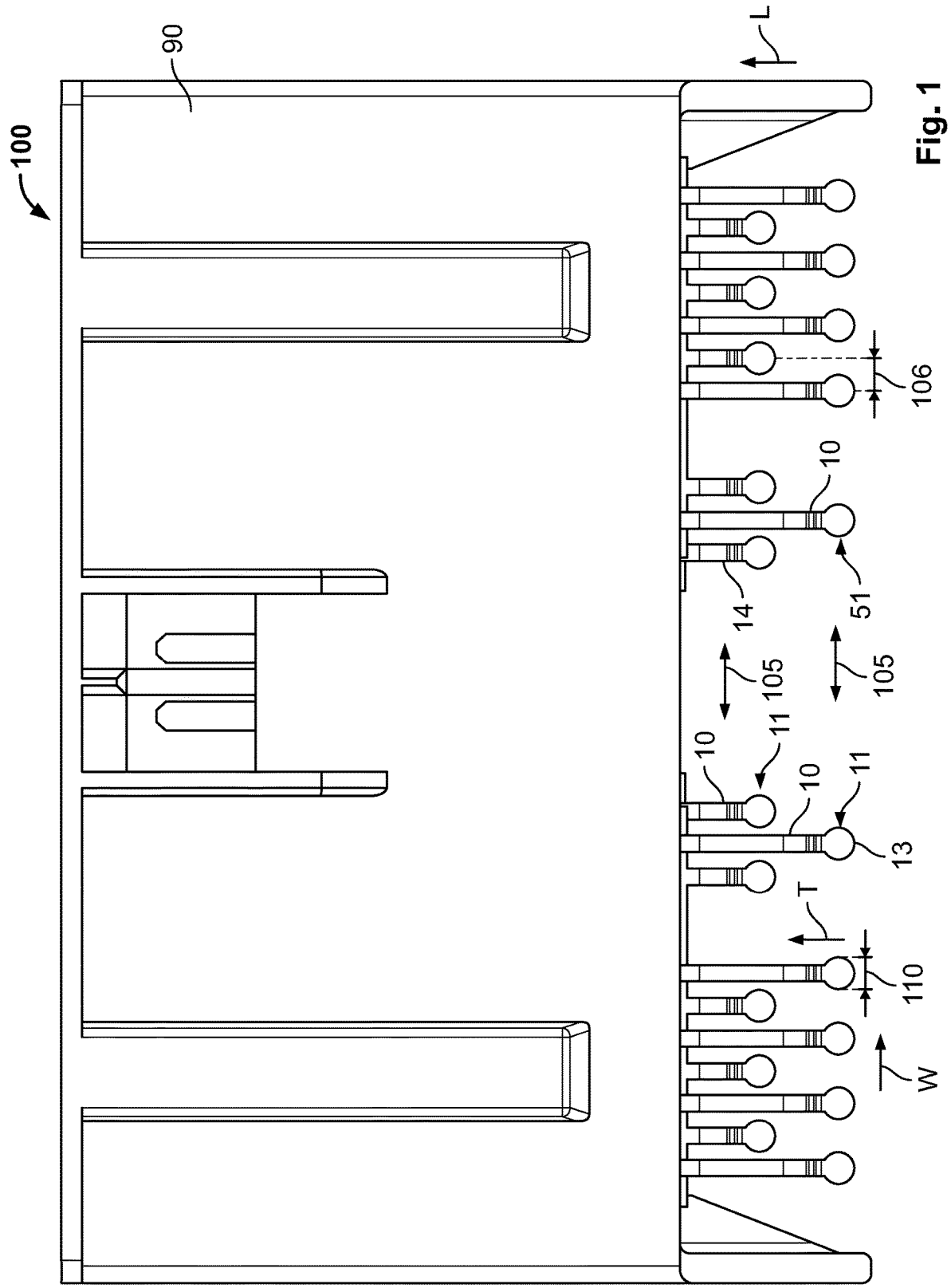
FIG. 1 is a top view of a pin header according to an embodiment.
Figure 2:
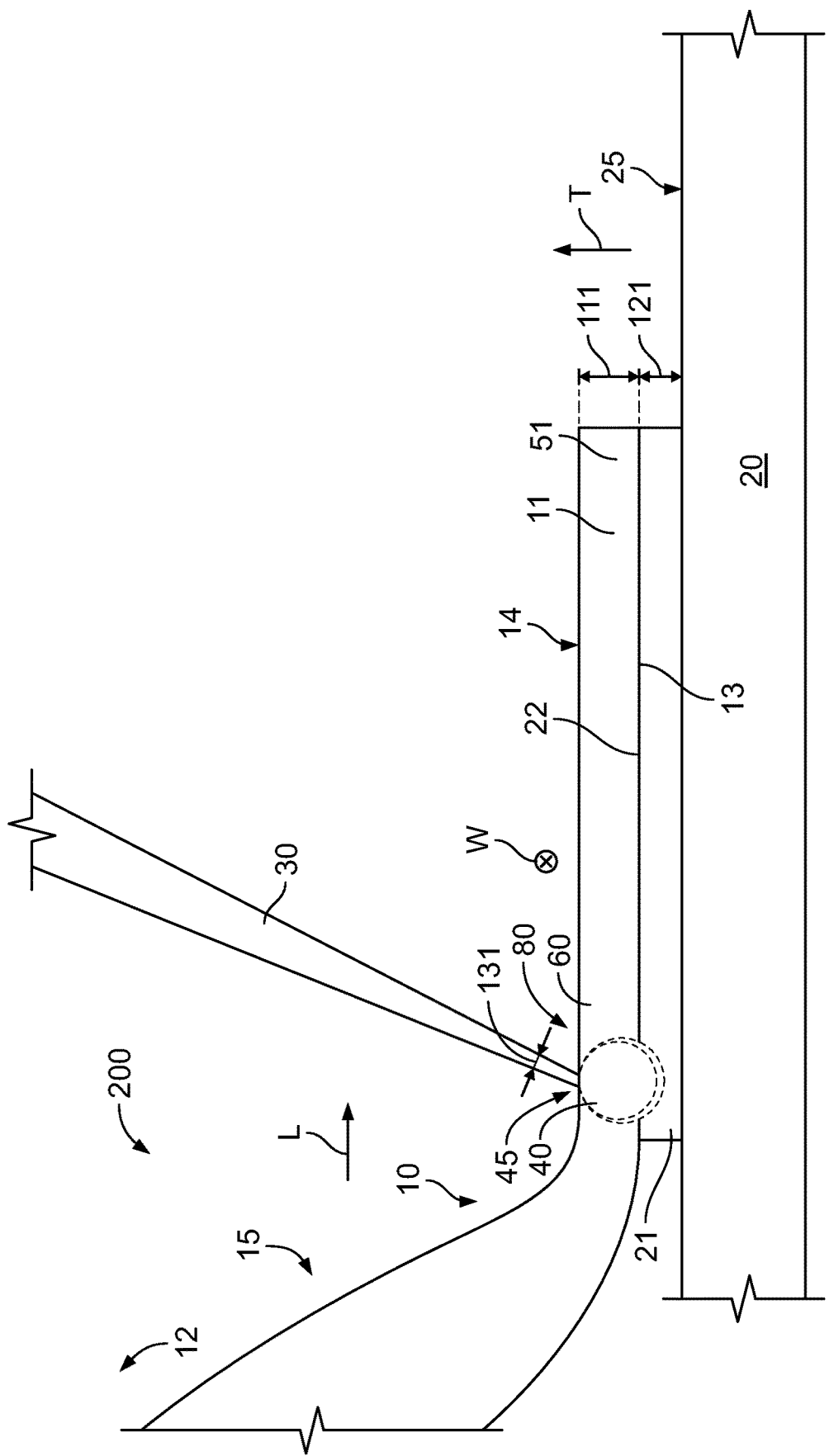
FIG. 2 is a sectional side view of a contact element according to an embodiment on a conductor plate.

A pin header 100 according to an embodiment is shown in FIG. 1. The pin header 100 is attached to a conductor plate 20, shown in FIG. 2. The pin header 100 has a plurality of contact elements 10, as shown in FIGS. 1 and 2, which are connected to a plurality of conductive paths 21 on the conductor plate 20. On a side opposite the conductor plate 20, the pin header 100 has a plug-in face so the contact elements 10 can be connected to a mating plug (not shown). The plug-in face can be configured in accordance with internal or external standards, such as a protruding pin or a socket, so that it can be plugged together with the mating plug according to such standards. As shown in FIG. 1, the contact elements 10 are arranged in a housing 90. In an embodiment, the housing 90 is made from an insulating plastic.

Figure 5:
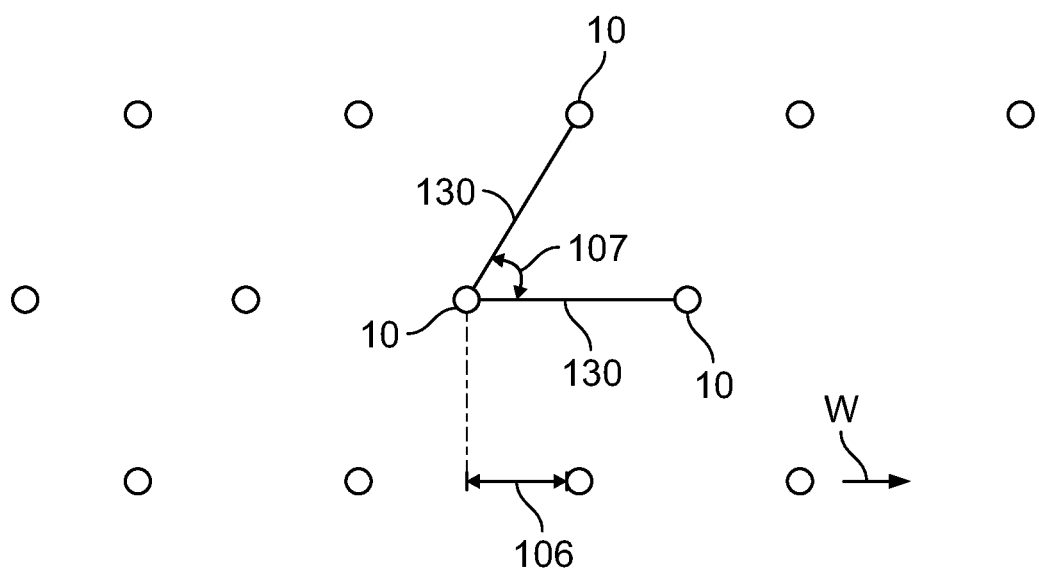
FIG. 5 is a schematic view of an assembly of a plurality of contact elements.

As shown in FIGS. 1 and 5, the contact elements 10 are arranged in several rows 105, with adjacent rows 105 being offset from one another by an offset 106. The individual contact elements 10 are arranged in a hexagonal grid, so that a central contact element 10 is surrounded by six further contact elements 10, from each of which it has a same distance 130. Three contact elements 10 in each case consequently form an equilateral triangle. An angle 107, measured between three contact elements 10 with a contact element 10 as the base, is 60 degrees.

In other embodiments, the angle 107 can be smaller or larger, depending on the distance between the individual rows 105 and the distance 130 between the individual contact elements 10 in a row 105.

Figure 3:
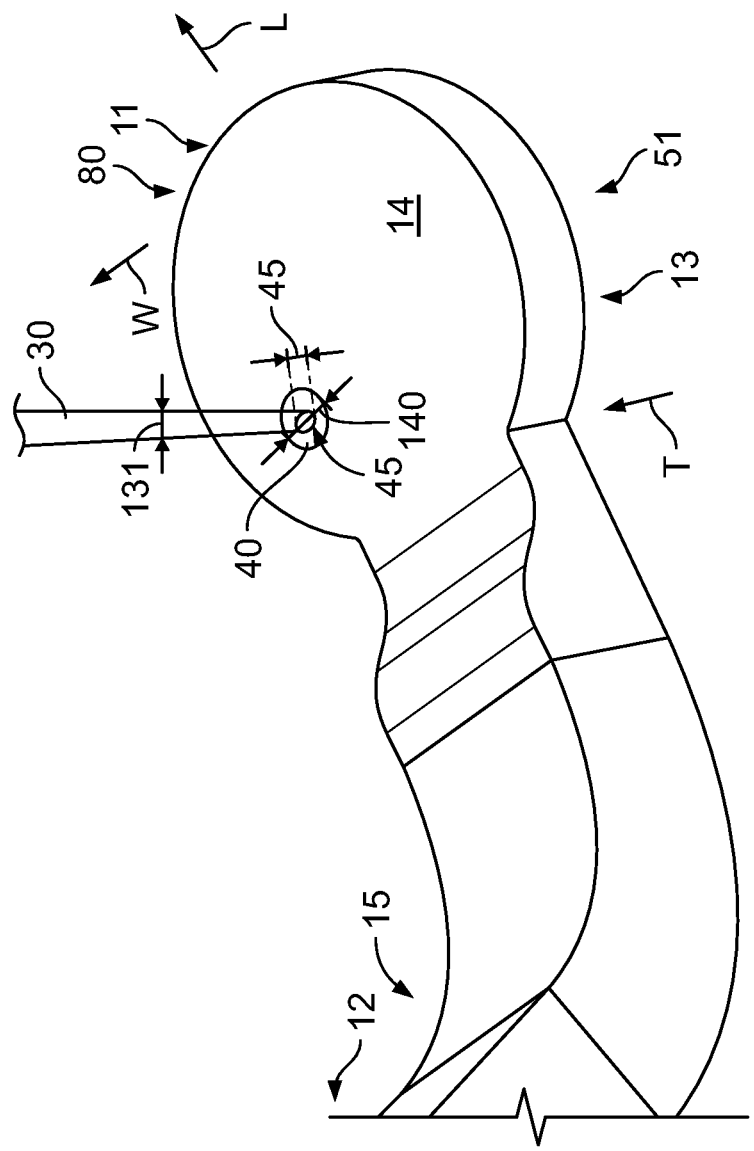
FIG. 3 is a perspective view of the contact element.

As shown in FIGS. 2 and 3, a first end 11, an end to be welded, of the contact element 10 is flattened. In an embodiment, the flattening of the first end 11 can be achieved by a stamping, a rolling, or an embossing process. In the shown embodiment, the first end 11 is configured as a disc 51 which is circular, for example. A thickness 111 of the first end 11, measured in a thickness direction T which is measured perpendicular to the plane of the flat first end 11 and perpendicular to a surface 25 of the conductor plate 20, is in terms of magnitude approximately a thickness 121 of the conductive path 21 on the conductor plate 20. This enables good welding of the first end 11 to the conductive path 21 to one another. In general, a ratio of the thickness 121 of the conductive path 21 to the thickness 111 of the contact element 10, in particular of the first end 11, should be at least 0.3. A ratio of 2.0 can be regarded as a maximum ratio to obtain a good welding result. The first end 11 extends parallel to the surface 25 of the conductor plate 20.

A laser beam 30, as shown in FIGS. 2 and 3, is used to weld the contact element 10 to the conductive path 21. The laser beam 30 is directed onto a rear side 14 of the flat first end 11 of the contact element 10. The rear side 14 is a side opposite a front side 13 which is in contact with the conductive path 21. The front side 13 is in contact with a surface 22 of the conductive path 21 and is welded with this, or onto this.

The striking of the laser beam 30 onto the contact element 10 causes a heating, in particular a melting, so that the contact element 10 is welded with or onto the conductive path 21. A width 131 of the laser beam 30, shown in FIGS. 2 and 3, and a focusing region 45 onto which the laser beam 30 is focused are in an embodiment chosen to be so small that the fused region 40 has a width 140 that is small compared to a width 110 of the contact element 10, in particular of the first end 11 as shown in FIG. 1. As a result, the energy input and the warming-up are kept minimal so that the conductor plate 20, which is heat-sensitive, incurs no damage. In an embodiment, the focusing region 45 onto which the laser beam 30 is focused, and/or the width 140 of the fused regions 40 are smaller than the width 110 of the contact element 10 by a factor of 10 or more. In an embodiment, the focusing region 45 on which the laser beam 30 is focused is smaller than one-tenth of the thickness 111 of the contact element 10.

In an embodiment, the laser beam 30 fuses a material 60 of the contact element 10 in the fused region 40 having a radius which corresponds to 3.0 times the width 131 of the laser beam 30. In other embodiments, the region 40 may be smaller, for example twice the width 131 of the laser beam 30 or equal to a single width 131 of the laser beam 30. The width 131 of the laser beam 30 can be defined as, for example, the distance between two opposing points at which the intensity has dropped to $1/e^2$.

Figure 4:
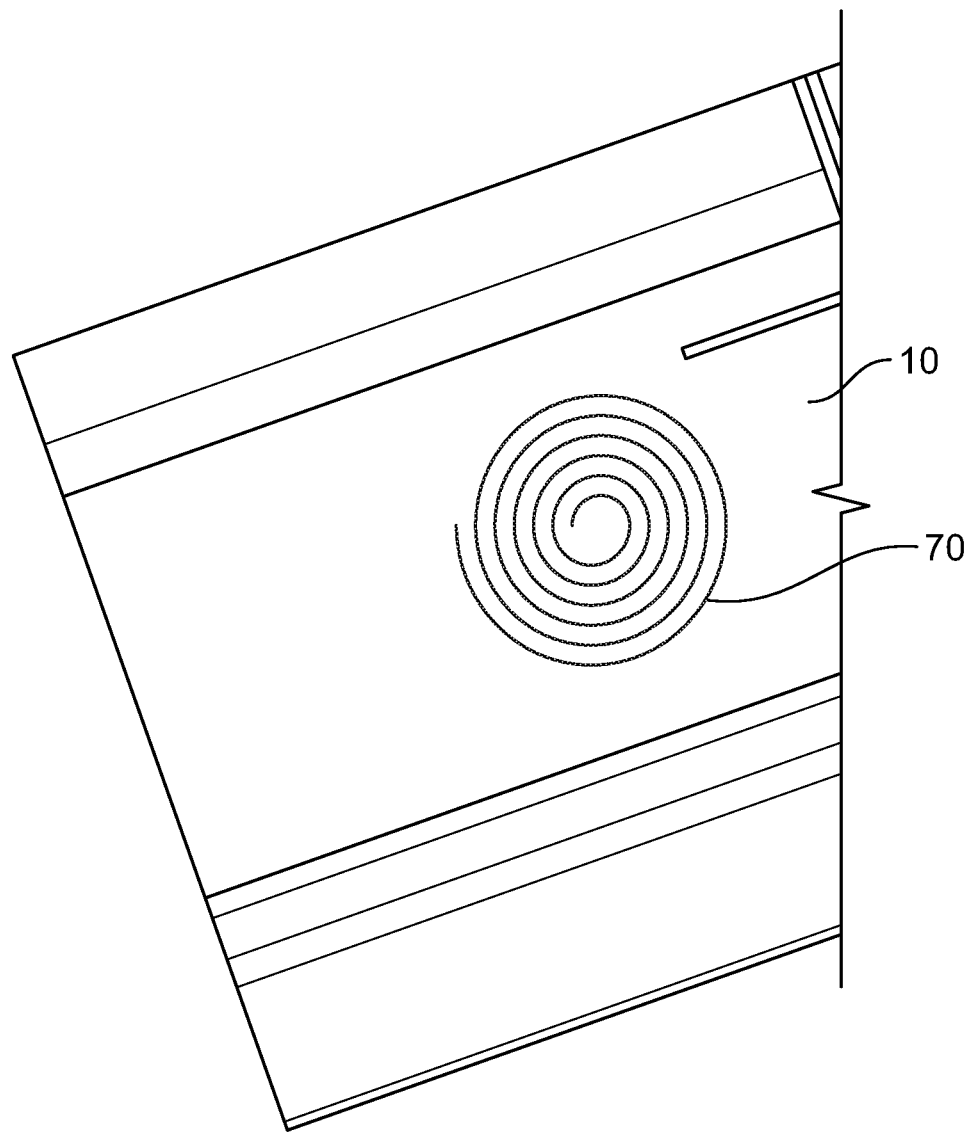
FIG. 4 is a perspective view of a path of a laser beam on the contact element.

In an embodiment shown in FIGS. 3 and 4, in order to further restrict the local fusing of the material 60 of the contact element 10, the laser beam 30 can be pulsed, so that only short intensive laser pulses strike a surface 80 of the material 60. The pulses can lead to heating up which is restricted both in terms of duration and location, with neighboring regions, in particular the conductor plate 20, being subjected to less thermal stress.

As shown in FIG. 4, a path 70 along which the laser beam 30 is guided can be spiral-shaped. This can, for example, lead to the region 40 having sufficient time to cool before the laser beam 30 causes heating in its vicinity in a further round. In other embodiments, other forms of the path 70 are also possible, for instance a linear pattern.

As shown in FIGS. 2 and 3, the contact elements 10 shown are substantially pin-shaped, in particular in a middle region 15, which is situated between the first end 11 and the second end 12. The contact elements 10 extend along a longitudinal direction L which is perpendicular to a width direction W and perpendicular to a thickness direction T, the thickness direction T is perpendicular to the width direction W.

The pin header 100 is configured such that all of the contact elements 10 shown can be mounted on the conductor plate 20 in a surface-mounted manner; it is not necessary to bore holes into the conductor plate 20. Further, it is not necessary to use flux. The outlay in terms of manufacture is therefore reduced. Through the use of the laser beam 30 that achieves heating only locally in a small region 40, it is nevertheless possible to bring about a welding between the contact element 10 and the conductive path 21 without the conductor plate 20 being exposed to high temperatures.

What is claimed is:

1. A method of attaching a contact element to a conductor plate, comprising:

welding the contact element to a conductive path of the conductor plate in a surface-mounted manner with a laser beam, the laser beam melts a material of the contact element only in a fused region, the fused region has a width smaller than a width of the contact element by a factor of ten or more, the fused region has a radius at a surface of the contact element that is greater than or equal to a width of the laser beam and less than or equal to three times the width of the laser beam; and flattening an end of the contact element before the welding step, the end of the contact element is welded to the conductive path in the welding step.

2. The method of claim 1, wherein the contact element is pin-shaped.

3. The method of claim 1, wherein the contact element is welded onto a surface of the conductive path.

4. The method of claim 1, wherein the laser beam is pulsed in the welding step.

5. The method of claim 1, wherein the laser beam is guided along a spiral path on a surface of the contact element in the welding step.

6. The method of claim 1, wherein the laser beam is focused on a focusing region which is smaller than one-tenth of a thickness of the contact element.

7. The method of claim 1, wherein the contact element is part of a pin header that includes a plurality of contact elements arranged in a plurality of rows that are offset from one another.

8. The method of claim 1, wherein the end of the contact element is stamped or rolled in the flattening step.

9. The method of claim 1, wherein a ratio of a thickness of the conductive path to a thickness of the contact element is at least 0.3.

10. The method of claim 1, wherein the end of the contact element is a circular disc.

11. The method of claim 1, wherein a thickness of the conductive path is less than a thickness of the contact element.

* * * * *